United States Patent [19]
Hayashi et al.

[11] Patent Number: 5,609,688
[45] Date of Patent: Mar. 11, 1997

[54] APPARATUS FOR PRODUCING SEMICONDUCTOR DEVICE

[75] Inventors: Tetsuya Hayashi, Kawasaki; Kazunori Okuyama, Aizuwakamatsu; Tsuyoshi Inomata, Kawasaki; Koji Nozaki, Kawasaki; Minoru Hirose, Kawasaki, all of Japan

[73] Assignee: Fujitsu Ltd., Kawasaki, Japan

[21] Appl. No.: 215,603

[22] Filed: Mar. 22, 1994

[30] Foreign Application Priority Data

May 7, 1993 [JP] Japan ................................. 5-106358
Oct. 27, 1993 [JP] Japan ................................. 5-268974

[51] Int. Cl.$^6$ ................................................. C23C 16/00
[52] U.S. Cl. .................... 118/715; 117/200; 118/719; 118/728
[58] Field of Search .................... 118/715, 719, 118/728; 117/200

[56] References Cited

U.S. PATENT DOCUMENTS

| | | | |
|---|---|---|---|
| 5,100,502 | 3/1992 | Murdoch et al. | 156/643.1 |
| 5,288,379 | 2/1994 | Namiki et al. | 118/719 |
| 5,344,542 | 9/1994 | Maher et al. | 118/729 |
| 5,422,889 | 6/1995 | Pollock et al. | 118/719 |

*Primary Examiner*—R. Bruce Breneman
*Assistant Examiner*—FeLisa Garrett
*Attorney, Agent, or Firm*—Staas & Halsey

[57] ABSTRACT

A semiconductor device producing method includes the steps of (a) subjecting a substrate which is transported by first transport means to at least a first process within a first unit, and (b) subjecting the substrate which is subjected to the step (a) and is transported by second transport means other than the first transport means to at least a second process within a second unit.

25 Claims, 13 Drawing Sheets

APPARATUS FOR PRODUCING SEMICONDUCTOR DEVICE

BACKGROUND OF THE INVENTION

The present invention generally relates to methods and apparatuses for producing semiconductor devices, and more particularly to a method and to an apparatus for producing a semiconductor device by transporting a wafer or the like by a transport unit and subjecting the transported wafer or the like to a predetermined process.

When producing a semiconductor device, it is desirable to reduce the generation of particles and to reduce contamination. In addition, when transporting a wafer or the like, it is desirable that substance generated during a process will not become a contaminating substance and affect another process.

Recently, the integration density of semiconductor devices has improved considerably, and LSIs and VLSIs have been reduced to practice. Due to the high integration density resulting from such an improvement, a minimum line width of a wiring pattern, for example, has been reduced to the μm order. In order to form a fine pattern, it is necessary to establish a technique for forming the fine pattern. For this reason, the wavelength of exposure light used in exposure apparatuses is being shifted to the short wavelengths in order to cope with the formation of the fine pattern. For example, the light source of the exposure apparatus outputs a g-line having a wavelength of 436 nm when making a 1M DRAM, and outputs an i-line having a wavelength of 365 nm when making a DRAM having a memory capacity in the range of 16M to 64M. In addition, it may be regarded that a KrF excimer laser which outputs a light having a wavelength of 248 nm will be used primarily when making a DRAM having a memory capacity in the range of 64M (shrink version) to 256M, and a ArF excimer laser which outputs a light having a wavelength of 193 nm will be used primarily when making a DRAM having a memory capacity greater than 256M.

According to the exposure method which uses the excimer laser, it is presently regarded that the resist used for the pattern transfer will be a chemically amplified resist, when the sensitivity and transparency are taken into consideration. However, as is known from S. MacDonald et al., "Airborne Chemical Contamination of a Chemically Amplified Resist", Proc. SPIE Vol.1466, Advances in Resist Technology and Processing VIII, 1991, pp.2–12, the performance of the chemically amplified resist greatly deteriorates due to the existence of even an extremely small amount of amine system substance in the atmosphere, including ammonia system substance. Accordingly, if the amine system substance exists, it will be difficult to carry out a satisfactory pattern formation using the chemically amplified resist.

Therefore, in the semiconductor device production of the next generation using the chemically amplified resist, it will become necessary to positively prevent contamination in the resist coating process and the developing process by even an extremely small amount of amine system substance.

Presently, as a preparation process which is carried out when coating the resist, there is a known method which processes the substrate surface by a hydrophobic processing agent such as hexamethyldisilazane (HMDS), in order to prevent the developing agent from spreading to the interface between the resist and the substrate and causing separation. However, ammonia will be generated when this HMDS is hydrolyzed. In addition, an amine system gas is generated from an alkaline solution which is used for the developing agent. For this reason, the contamination sources of the amine system substance which must be eliminated when using the chemically amplified resist, exist from the substrate preparation process to the developing process.

According to the conventional semiconductor device producing apparatus, the same transport unit is used to transport the substrate for the resist coating process and the developing process, for example. In other words, the transport unit used for each process is not used exclusively for the process, and one transport unit is used in common fop a plurality of processes. For this reason, there was a problem in that contaminating substance or the like originating from for example the HMDS gas adhered to the transport unit during one process will be carried to another process when the transport unit transports the substrate. In addition, since one transport unit is used in common for a plurality of processes, there was also a problem in that the contaminating substances adhered to the transport unit duping one or a plurality of processes will be carried to other processes.

SUMMARY OF THE INVENTION

Accordingly, it is a general object of the present invention to provide a novel and useful method and apparatus for producing semiconductor device, in which the problems described above are eliminated.

Another and mope specific object of the present invention is to provide a semiconductor device producing method comprising the steps of (a) subjecting a substrate which is transported by first transport means to at least a first process within a first unit, and (b) subjecting the substrate which is subjected to the step (a) and is transported by second transport means other than the first transport means to at least a second process within a second unit. According to the semiconductor device producing method of the present invention, it is possible to selectively use the transport means so that the contamination substance from one process or one process group is prevented from being carried and diffusing to another process or another process group. Hence, the present invention is particularly suited for application to a process which uses a chemically amplified resist.

Still another object of the present invention is to provide a semiconductor device producing method comprising the steps of (a) selectively holding one kind of substrate by each of holding parts of a chuck, and (b) transporting the substrate held by one holding part of the chuck, so that contamination via the holding parts of the chuck is avoided when transporting different kinds of substrates, where the different kinds of substrates include substrates made of different materials and/or substrates having different layer materials formed thereon. According to the semiconductor device producing method of the present invention, it is possible to selectively use the holding parts depending on the kind of substrate to be transported, so as to reduce the effects of the material forming the substrate on another substrate. In addition, it is possible to minimize the manual transport of the substrate and accordingly reduce contamination caused by the manual transport.

A further object of the present invention is to provide a semiconductor device producing method comprising the steps of (a) holding one kind of substrate by each of holding parts of a chuck at approximately the same frequency, and (b) transporting the substrate held by one holding part of the chuck, so that contamination via the holding parts of the chuck is averaged when transporting one kind of substrate, where the one kind of substrate includes substrates made of the same material and/or substrates having the same layer material formed thereon. According to the semiconductor device producing method of the present invention, it is possible to selectively use the holding parts depending on the kind of substrate to be transported, so as to reduce the effects of the material forming the substrate on another substrate. In addition, it is possible to minimize the manual transport of the substrate and accordingly reduce contamination caused by the manual transport.

Another object of the present invention is to provide a semiconductor device producing method comprising the steps of (a) transporting a substrate to an arbitrary unit by holding the substrate by a first holding part, and (b) holding the substrate by a second holding part within the arbitrary unit, where the step (a) transports the substrate so that the first holding part makes contact with a portion of the substrate other than a portion of the substrate contacted by the second holding part. According to the semiconductor device producing method of the present invention, it is possible to prevent particles adhered on the substrate from adhering to the holding part within the unit.

Still another object of the present invention is to provide a semiconductor device producing apparatus comprising a plurality of units respectively subjecting a substrate to at least one process, and transport means for holding and transporting the substrate among the units, where the transport means includes a substrate holding part which is provided exclusively for use with respect to at least an arbitrary one of the units. According to the semiconductor device producing apparatus of the present invention, it is possible to selectively use the transport means so that the contamination substance from one process or one process group is prevented from being carried and diffusing to another process or another process group. Hence, the present invention is particularly suited for application to a process which uses a chemically amplified resist.

A further object of the present invention is to provide a semiconductor device producing apparatus comprising a unit subjecting a substrate to at least one process, and transport means having a plurality of holding parts for holding the substrate, where the transport means selectively holds the substrate by one of the holding parts depending on a state of the substrate. According to the semiconductor device producing apparatus of the present invention, it is possible to selectively use the holding parts depending on the kind of substrate to be transported, so as to reduce the effects of the material forming the substrate on another substrate. In addition, it is possible to minimize the manual transport of the substrate and accordingly reduce contamination caused by the manual transport.

Another object of the present invention is to provide a semiconductor device producing apparatus comprising a unit having first holding means for holding a substrate within the unit which carries out an arbitrary process with respect to the substrate, and transport means, having second holding means for holding the substrate, for transporting the substrate held by the second holding means to the unit, where the first holding means makes contact with a portion of the substrate other than a portion of the substrate contacted by the second holding means. According to the semiconductor device producing apparatus of the present invention, it is possible to prevent particles adhered on the substrate from adhering to the holding means within the unit.

Other objects and further features of the present invention will be apparent from the following detailed description when read in conjunction with the accompanying drawings.

DESCRIPTION OF THE PREFERRED EMBODIMENTS

First, a description will be given of a first embodiment of a semiconductor device producing apparatus according to the present invention, by referring to FIGS. 1 through 7.

Figure 1:
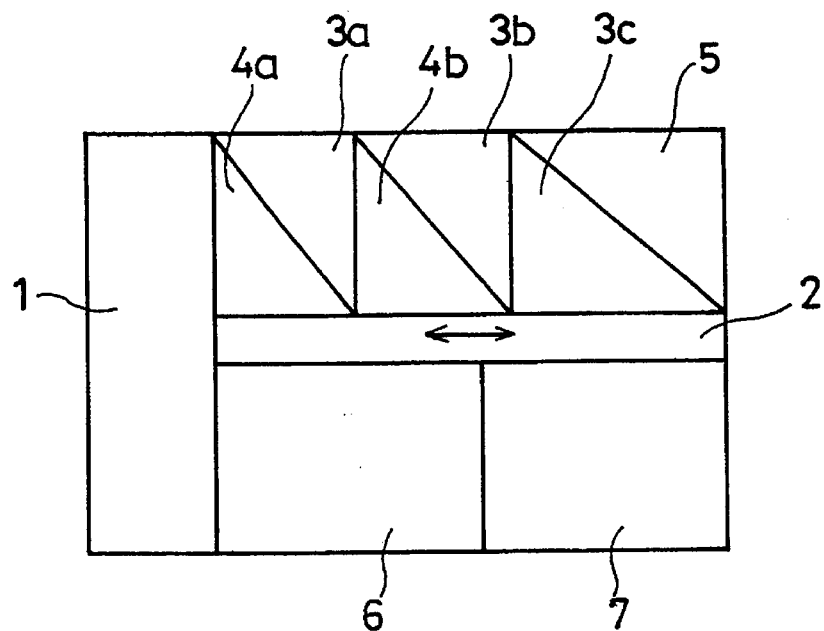
FIG. 1 is a plan view showing the general construction of an important part of a first embodiment of a semiconductor device producing apparatus according to the present invention.

FIG. 1 is a plan view showing the general construction of an important part of the first embodiment. The semiconductor device producing apparatus shown in FIG. 1 includes an indexer module 1 for receiving a substrate (not shown) which is to be processed, a transport unit 2 for transporting the substrate, a plurality of oven units 3a, 3b and 3c for subjecting the substrate to a thermal process, a plurality of cleaning units 4a and 4b for cleaning the substrate, a preparation unit 5 for carrying out a preparation process with respect to the substrate before coating a resist, a coater unit 6 for coating the resist on the substrate, and a developing unit 7 for carrying out a developing process. Each of the units shown in FIG. 1 are shown in blocks, and the shape of the blocks of course are unrelated to the actual shades of the units.

Figure 2:
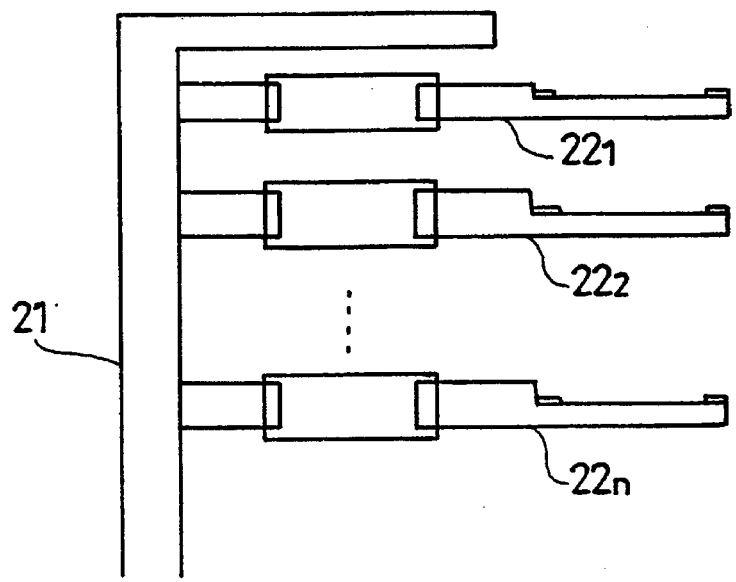
FIG. 2 is a side view showing an important part of a transport unit.
Figure 3:
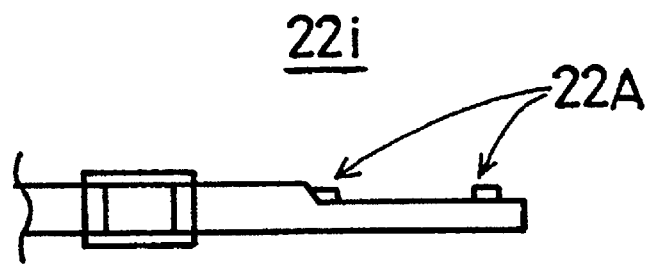
FIG. 3 is a side view showing a tip end part of an arm.

FIG. 2 is a side view showing an important part of the transport unit 2. FIG. 3 is a side view showing a tip end part of one arm of the transport unit 2. The transport unit 2 includes a transport base 21 which is driven by a driving unit (not shown). The transport base 21 is moved in directions indicated by arrows in FIG. 1 to positions where the substrate can be extracted from the indexer module 1 and the substrate and be inserted and extracted with respect to each of the units 3a, 3b, 3c, 4a, 4b, 5 and 6. A plurality of arms $22_1$ through $22_n$ are provided on this transport base 22. Each arm $22_i$ has a plurality of claws 22A provided at the tip end portion (or the chuck portion) thereof, where i=1, ..., n. For example, each claw 22A is made of or coated with Teflon.

Figure 4:
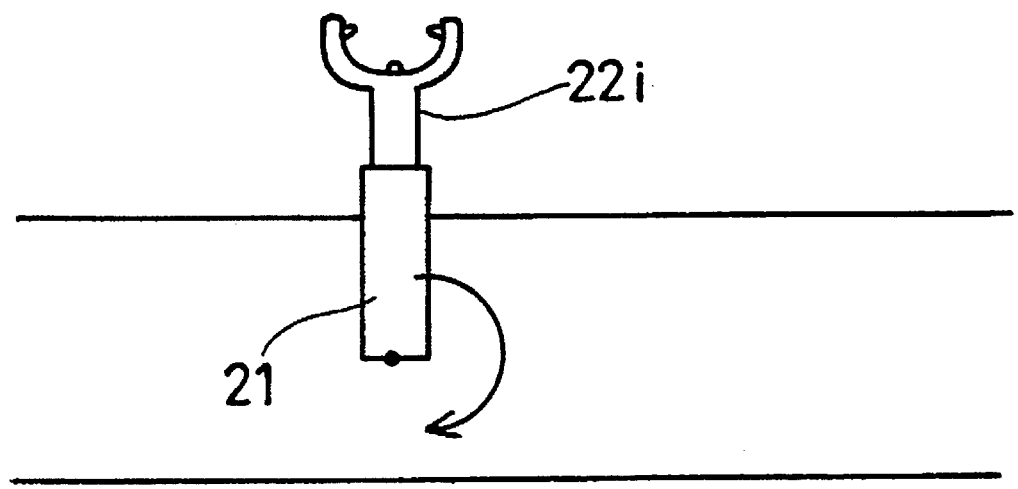
FIG. 4 is a diagram for explaining a rotation of the transport unit.
Figure 5:
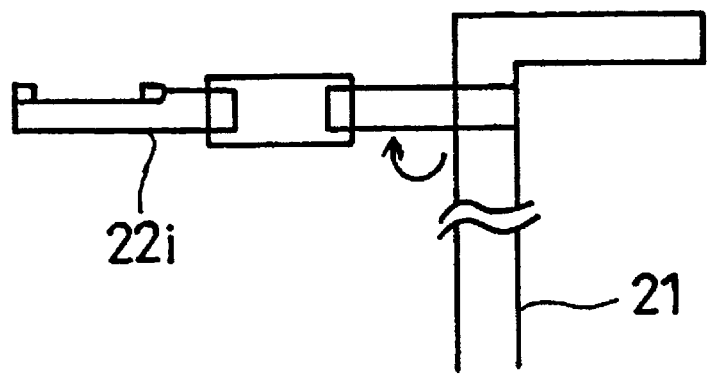
FIG. 5 is a diagram for explaining a rotation of the arm.
Figure 6:
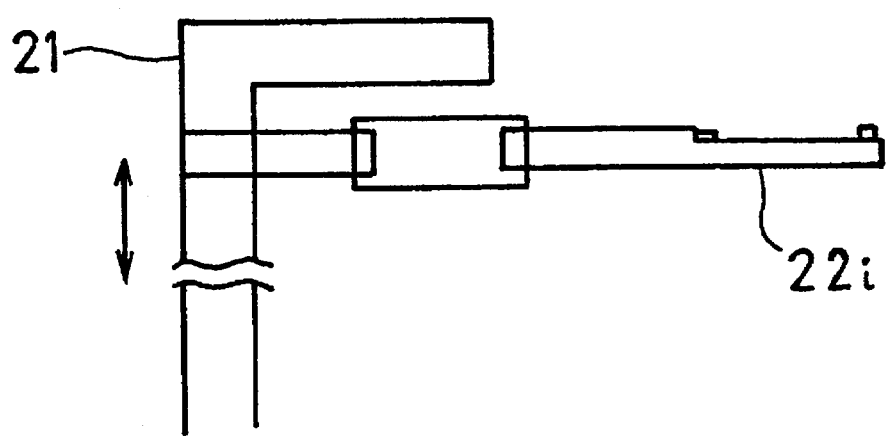
FIG. 6 is a diagram for explaining upward and downward movements of the transport apparatus or the arm.

When inserting the substrate into an arbitrary unit or extracting the substrate from the arbitrary unit, the arm $22_i$ which corresponds to this arbitrary unit is rotated to a position confronting the arbitrary unit. In this case, the entire transport base 21 may rotate as shown in FIG. 4 or, only the arm $22_i$ may rotate as shown in FIG. 5. In addition, the entire transport base 21 may be designed to move upwards and downwards as shown in FIG. 6 or, each arm $22_i$ may be designed to move upwards and downwards as shown in FIG. 6.

Figure 7A:
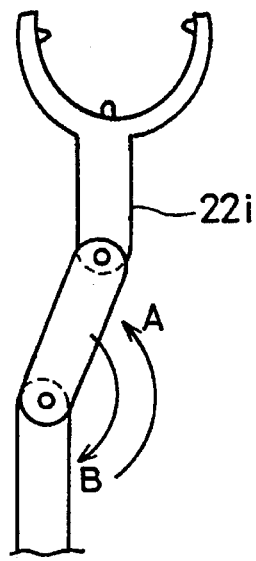
FIGS. 7A and 7B respectively are plan views for explaining the operation of the arm.
Figure 7B:
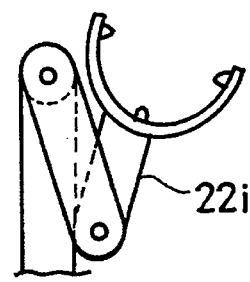

When extracting the substrate from the arbitrary unit, an intermediate portion of the arm $22_i$ rotates in a direction A in FIG. 7A. As a result, the arm $22_i$ extends and the substrate within the arbitrary unit is placed on the claws 22A of the arm $22_i$. In addition, when inserting the substrate into the arbitrary unit, the arm $22_i$ also extends, and the substrate placed on the claws 22A is inserted into the arbitrary unit. On the other hand, when the operation of inserting or extracting the substrate ends, the intermediate portion of the arm $22_i$ rotates in a direction B in FIG. 7A. Hence, the arm $22_i$ contracts as shown in FIG. 7B. Each arm $22_i$ is in this contracted state shown in FIG. 7B when moving the transport base 21.

In this embodiment, the arm $22_1$, for example, carries out the insertion and extraction of the substrate with respect to the preparation unit 5, and the extracted substrate is placed on the indexer module 1. In addition, the arm $22_2$, for example, carries out the insertion and extraction of the substrate with respect to the coater unit 6, and the substrate extracted from the coater unit 6 is placed on the indexer module 1. Furthermore, the arm $22_3$, for example, carries out the insertion and extraction of the substrate with respect to the developing unit 7, and the substrate extracted from the developing unit 7 is placed on the indexer module 1. Accordingly, even if a contaminating substance adhere on the arm $22_1$, $22_2$ or $22_3$, the contaminating substance will not be carried into another unit and diffuse because the arms $22_1$, $22_2$ and $22_3$ are respectively used exclusively with respect to the units 5, 6 and 7. For this reason, when forming the pattern using the chemically amplified resist in particular, the shape of the formed pattern becomes extremely satisfactory and the dimensional accuracy of the pattern is greatly improved.

Each arm $22_i$ may be designed to carry out the insertion and extraction of the substrate with respect to only one corresponding unit. However, if no contaminating substance exists or the effects of the contaminating substance on the process carried out in another unit are negligible, a specific arm may be designed to carry out the insertion and extraction of the substrate with respect to two or more units.

The construction of the transport unit 2 is of course not limited to that shown in FIGS. 2 through 7. The transport unit 2 may take any form as long as at least one arm is provided exclusively with respect to one unit for carrying out the insertion and extraction of the substrate with respect to this one unit. The illustration and description related to the driving unit of the transport base 21, a rotating mechanism of the transport base 21, a rotating mechanism of the arms $22_i$ and the like will be omitted in this specification. This is because the driving unit itself and the rotating mechanisms themselves are known, and those skilled in the art can readily understand that known driving unit and rotating mechanisms can be used in the above described embodiment.

Figure 8:
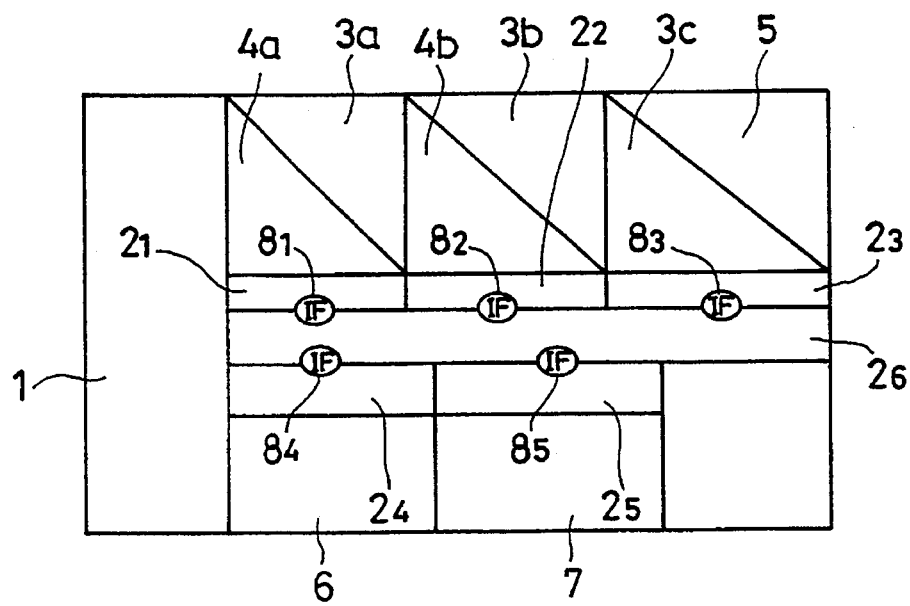
FIG. 8 is a plan view showing the general construction of an important part of a second embodiment of the semiconductor device producing apparatus according to the present invention.
Figure 9:
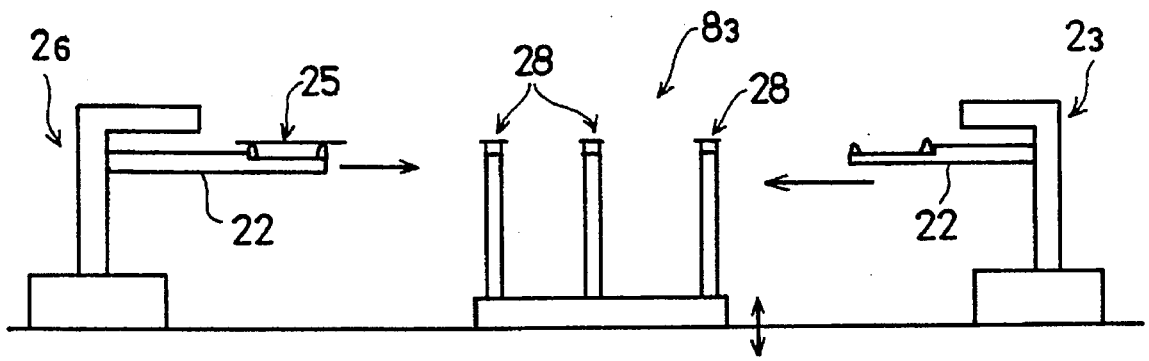
FIG. 9 is a diagram for explaining a transport of a substrate via an interface unit.

Next, a description will be given of a second embodiment of the semiconductor device producing apparatus according to the present invention, by referring to FIGS. 8 and 9. In FIGS. 8 and 9, those parts which are the same as those corresponding parts in FIGS. 1 through 7 are designated by the same reference numerals, and a description thereof will be omitted.

In this embodiment, a plurality of sub transport units $2_1$ through $2_5$, a main transport unit $2_6$, and a plurality of interface units $8_1$ through $8_5$ are provided as shown in FIG. 8. The sub transport unit $2_1$ is provided exclusively for units 3a and 4a, and the sub transport unit $2_2$ is provided exclusively for units 3b and 4b. The sub transport unit $2_3$ is provided exclusively for units 3c and 5. In addition, the sub transport unit $2_4$ is provided exclusively for the coater unit 6, and the sub transport unit $2_5$ is provided exclusively for the developing unit 7. The interface units $8_1$ through $8_5$ are respectively provided with respect to the corresponding sub transport units $2_1$ through $2_5$. The sub transport units $2_1$ through $2_5$ and the main transport unit $2_6$ may have the same construction, and may have a construction identical to that of the transport unit 2 of the first embodiment described above. But in this embodiment, it is sufficient that each of the transport units $2_1$ through $2_6$ have only one arm 22.

Each sub transport unit $2_j$ transports a substrate 25 between a corresponding unit (for example, the unit 3c or 5) and the corresponding interface unit $8_j$, where j=1, ..., 5. On the other hand, the main transport unit $2_6$ transports the substrate 25 between two interface units.

FIG. 9 is a diagram for explaining the transport of the substrate 25 from the main transport unit $2_6$ to the sub transport unit $2_3$ via the interface unit $8_3$. The substrate 25 is first placed on claws 28 of the interface unit $8_3$ from the main transport unit $2_6$. For example, each claw 28 is made of or is coated with Teflon. Next, the substrate 25 on the interface unit $8_3$ is extracted by the sub transport unit $2_3$ and is inserted into the unit 3c or 5. When placing the substrate 25 on the interface unit $8_3$ and when extracting the substrate 25 on the interface unit $8_3$, at least one of the arm of the transport unit $2_6$ or $2_3$ and the interface unit $8_3$ may be moved upwards or downwards, so as to enable smooth placement and extraction of the substrate 25 with respect to the interface unit $8_3$. In addition, the interface unit $8_3$ may be designed to be movable to the right and left in FIG. 9.

A first embodiment of a semiconductor device producing method employs the first or second embodiment of the semiconductor device producing apparatus described above.

More particularly, the first embodiment of the semiconductor device producing method takes measures so that an arm of a transport unit which is inserted into a first unit together with a substrate will not be inserted into a second unit which carries out a process different from a process carried out in the first unit. In other words, at least one arm of the transport apparatus or the transport apparatus is inserted only into a specific unit which carries out a specific process, together with the substrate, and is used exclusively for this specific unit.

Therefore, according to the first and second embodiments of the semiconductor device producing apparatus and the first embodiment of the semiconductor device producing method, the arm of the transport unit or the transport unit is properly used depending on the process. Hence, it is possible to carry out a desired process with respect to the substrate without carrying the contamination substrate from each process or each process group to another process or another process group. As a result, it is possible to positively prevent the diffusion of the contamination caused by the transport unit. For this reason, it is possible to stable form the resist pattern, and these embodiments are particularly suited for application to a process which uses the chemically amplified resist.

Actually, there is also generation of the amine system substance caused by the clean room environment, such as the adhesive agent and the paint material used for the coating within the clean room. However, in the conventional semiconductor device producing apparatus, the units which carry out the resist coating process and the developing process are not mutually isolated and sealed. Consequently, there is a possibility of the substrate processing atmosphere diffusing to another process or process group, and the contaminating substance caused by the environment may be carried to another process or process group. In such cases, the performance of the resist will be lost. Particularly in the case where the chemically amplified resist is used, it is essential that the contaminating substance caused by the environment is prevented from being carried into another process and diffusing.

Figure 10:
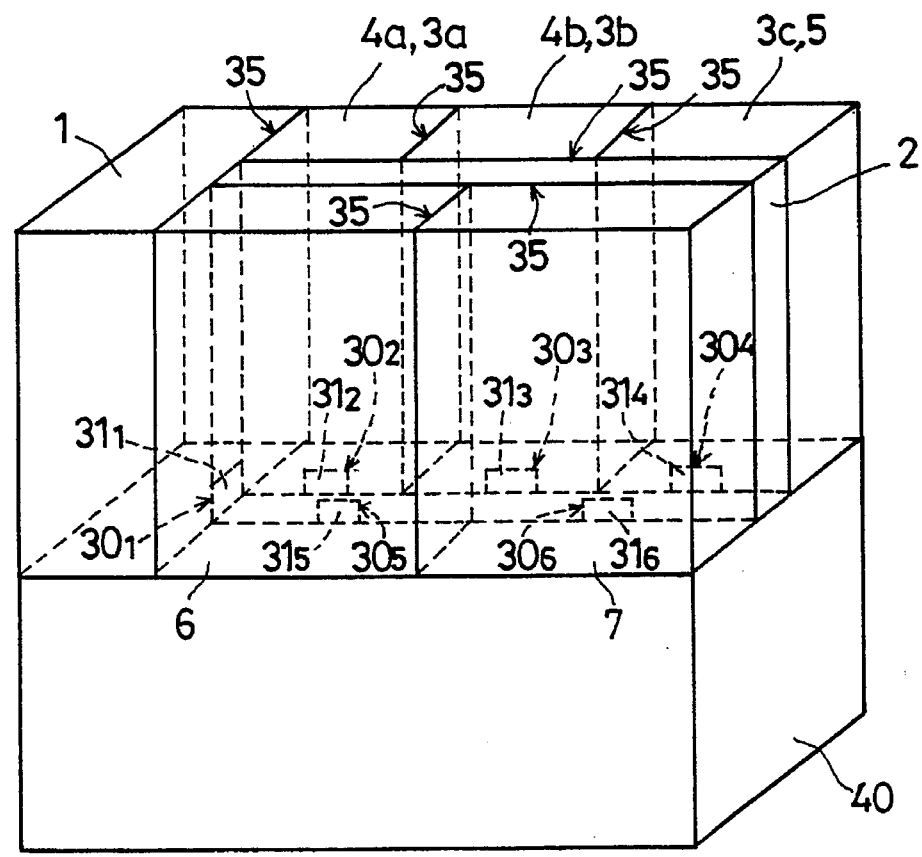
FIG. 10 is a perspective view showing the general construction of an important part of a third embodiment of the semiconductor device producing apparatus according to the present invention.

Accordingly, a description will now be given of a semiconductor device producing apparatus which can eliminate this problem. FIG. 10 is a perspective view showing an important part of a third embodiment of the semiconductor device producing apparatus according to the present invention. In FIG. 10, those parts which are the same as those corresponding parts in FIG. 1 are designated by the same reference numerals, and a description thereof will be omitted.

In this embodiment, an arm $22_i$ is provided exclusively with respect to each process or each process group, similarly to the first embodiment of the semiconductor device producing apparatus. In addition, the processes or the process groups are mutually isolated and sealed.

In other words, in FIG. 10, the indexer module 1 and units 3a, 3b, 3c, 4a, 4b, 5 and 6 provided on a main body 40 are mutually isolated and sealed by an isolating member 35. When easy maintenance is taken into consideration, the isolating member 35 is desirably made of glass, acrylic resin, vinyl curtain and the like, but it is of course possible to use other materials which would provide the function of isolation and sealing. Openings $30_1$ through $30_6$ are formed in the isolating member 35, and these openings $30_1$ through $30_6$ are normally closed by corresponding shutters $31_1$ through $31_6$. The shutters $31_1$ through $31_6$ are slidable upwards and downwards or, to the right and left in FIG. 10, so that the corresponding openings $30_1$ through $30_6$ may be opened. For example, when inserting the substrate into or extracting the substrate from the coater unit 6 by the transport unit 2, the shutter $31_5$ is opened to expose the opening $30_5$ of the isolating member 35. The shutter $31_5$ closes to close the opening $30_5$ after the insertion or extraction of the substrate ends.

In this embodiment, the shutters $31_1$ through $31_6$ are normally closed and the indexer module 1 and the units 3a, 3b, 3c, 4a, 4b, 5 and 6 are mutually isolated and sealed by the isolating member 35. For this reason, it is possible to prevent the contaminating substance generated in one process or one process group from being carried out diffusing to another process or process group, similarly as in the case of the first embodiment of the semiconductor device producing apparatus. In addition, it is also possible to prevent the clean room atmosphere, that is, the contaminating substance caused by the clean room environment, from being carried and diffusing to another process or process group.

As a modification of this embodiment, it is possible to provide a clean bench (not shown) on top of the semiconductor device producing apparatus, and to supply to the clean bench chemically clean air or inert gas typified by nitrogen and argon. The clean bench and the chemically clean air will be described later.

The present inventors have conducted experiments using this embodiment of the semiconductor device producing apparatus and the conventional semiconductor device producing apparatus which does not have the means for isolating and sealing the processes or process groups. The experiments using the two semiconductor device producing apparatuses were conducted under the same conditions, and patterns were formed using a chemically amplified positive resist.

As a result, it was found that the density of ammonia gas becomes approximately 20 bbp when the conventional semiconductor device producing apparatus is used. In this case, the line width of the upper portion of the resist pattern became large due to the effects of the ammonia system gas, and it was impossible to obtain a desired dimensional accuracy.

On the other hand, the density of the ammonia gas decreased to approximately 4 ppb when this embodiment of the semiconductor device producing apparatus was used. In this case, the increase in the line width at the top portion of the resist pattern became extremely small, and it was confirmed that the desired dimensional accuracy can be obtained.

The experiments were also conducted for the modification of this embodiment having the clean bench. In this case, inert gas and chemically clean air were supplied to the clean bench. As a result, the density of the ammonia gas decreased further down to approximately 1 ppb, and it was confirmed that even more satisfactory results are obtainable.

Figure 11:
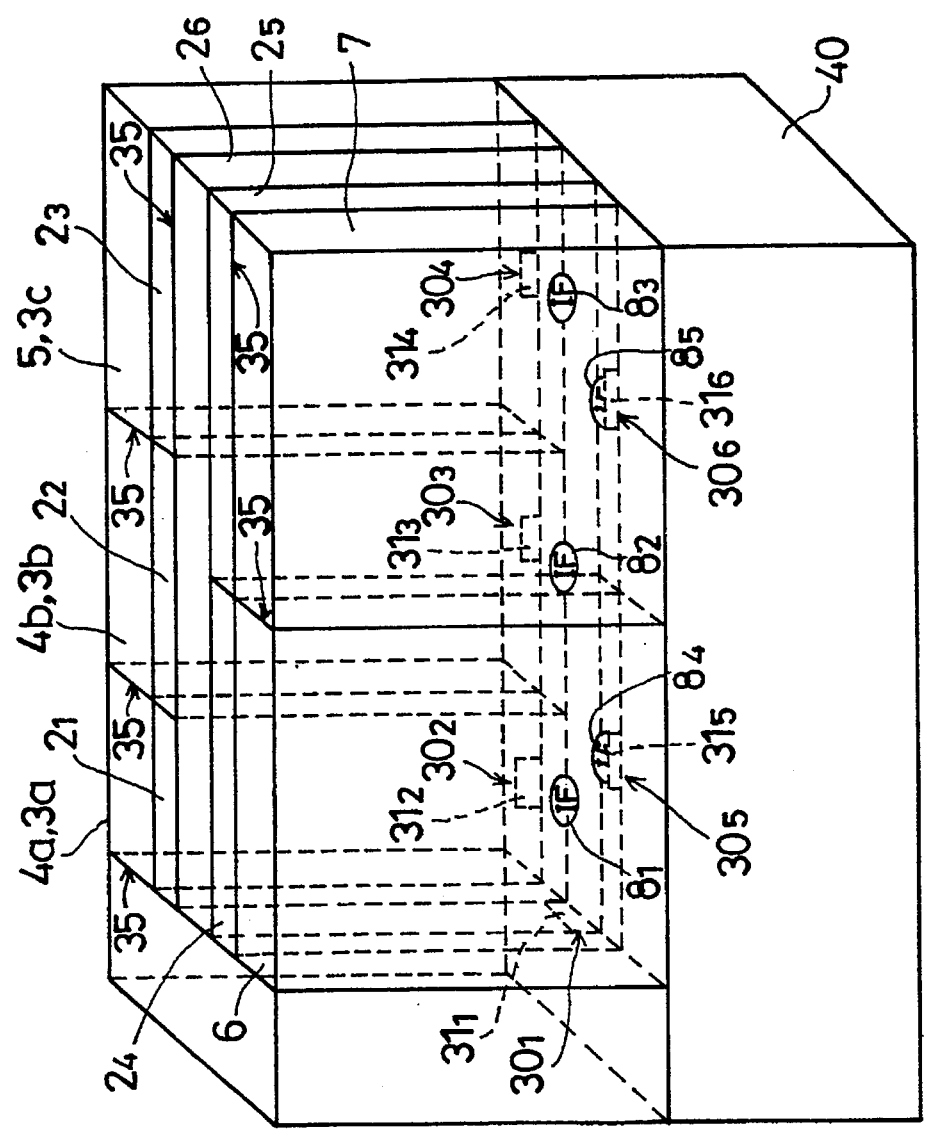
FIG. 11 is a perspective view showing the general construction of an important part of a fourth embodiment of the semiconductor device producing apparatus according to the present invention.

Next, a description will be given of a fourth embodiment of the semiconductor device producing apparatus according to the present invention, by referring to FIG. 11. FIG. 11 is a perspective view showing an important part of this fourth embodiment. In FIG. 11, those parts which are the same as those corresponding parts in FIGS. 8 and 10 are designated by the same reference numerals, and a description thereof will be omitted.

Similarly to the third embodiment of the semiconductor device producing apparatus described above, this fourth embodiment is also provided with the isolating member 35, the openings $30_1$ through $30_6$ and the shutters $31_1$ through $31_6$. In addition, in this embodiment, the sub transport units $2_1$ through $2_5$ are provided within the corresponding units 4a, 3a, 4b, 3b, 5, 3c, 6 and 7. Furthermore, the isolating member 35 is provided between the main transport unit $2_6$ and the sub transport units $2_1$ through $2_5$.

Figure 12:
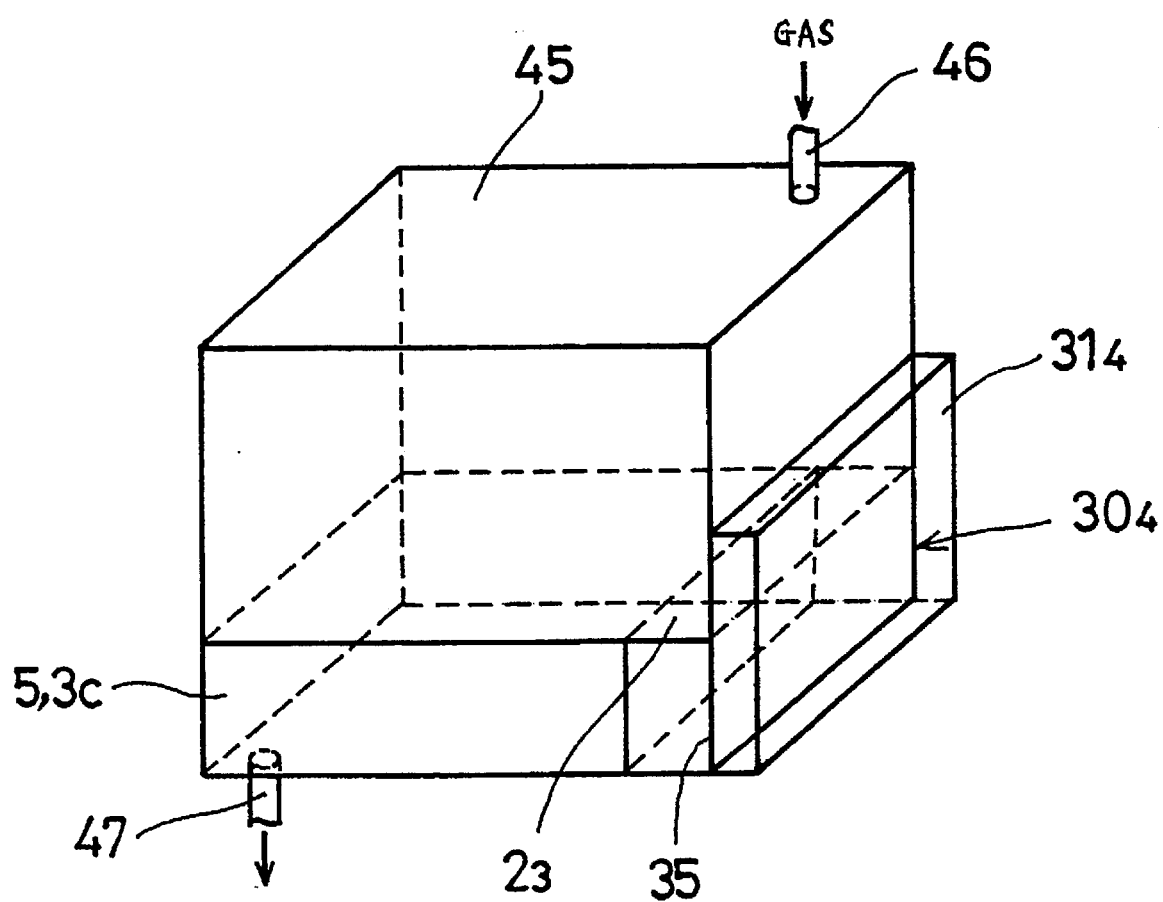
FIG. 12 is a perspective view showing a modification of the fourth embodiment.

FIG. 12 is a perspective view showing an important part of a modification of the fourth embodiment of the semiconductor device producing apparatus. In this modification, a clean bench 45 is provided with respect to the units 5 and 3c. However, it is of course possible to provide a clean bench with respect to each unit or each unit group. An inert gas or a chemically clean air is supplied to the clean bench 45 via an inlet 46. The inert gas or chemically clean air is exhausted from the units 5 and 3c via an outlet 47. When the problem caused by dust particles and the like is taken into consideration, it is desirable that the supply of the inert gas or chemically clean air is supplied downstream from the top portion to the bottom portion of the semiconductor device producing apparatus as shown in FIG. 12.

The chemically clean air is for example (1) air which is obtained by providing an air shower using a water shower passed through an acid ion conversion resin and thereafter passing it through a demister and a HEPA filter, (2) air which is obtained by passing it through a chemical filter using activated carbon as the adsorbent and thereafter through a HEPA filter, (3) air which is obtained by passing it through a chemical filter using an acid ion conversion resin as the adsorbent and thereafter through a HEPA filter, (4) air which is obtained by passing it through a chemical filter which is filled with a material which adsorbs amine system chemical substances and thereafter through a HEPA filter, and the like. The cleanliness of the chemically clean air preferably has an ammonia density of 1 ppb or less, and is more preferably 0.1 ppb or less.

In addition, in FIG. 12, it is desirable that a packing is provided between the shutter $31_4$ and the isolating member 35 so as to make the isolating effect more complete. Furthermore, the shutter $31_4$ is made of or is coated with Teflon, for example.

The present inventors have conducted experiments using this embodiment of the semiconductor device producing apparatus and the conventional semiconductor device producing apparatus which does not have the means for isolating and sealing the processes or process groups. The experiments using the two semiconductor device producing apparatuses were conducted under the same conditions, and patterns were formed using a chemically amplified positive resist.

As a result, it was found that the density of ammonia gas becomes approximately 20 bbp when the conventional semiconductor device producing apparatus is used. In this case, the line width of the upper portion of the resist pattern became large due to the effects of the ammonia system gas, and it was impossible to obtain a desired dimensional accuracy.

On the other hand, the density of the ammonia gas decreased to approximately 2 ppb when this embodiment of the semiconductor device producing apparatus was used. In this case, the increase in the line width at the top portion of the resist pattern became extremely small, and it was confirmed that the desired dimensional accuracy can be obtained.

The experiments were also conducted for the modification of this embodiment having the clean bench. In this case, inert gas and chemically clean air were supplied to the clean bench. As a result, the density of the ammonia gas decreased further down to approximately 0.5 ppb, and it was confirmed that even more satisfactory results are obtainable.

A second embodiment of the semiconductor device producing method according to the present invention employs the third or fourth embodiment of the semiconductor device producing apparatus described above. More particularly, the second embodiment of the semiconductor device producing method mutually isolates and seals the units or unit groups which carry out the different processes on the substrate. As a result, it is possible to prevent the contaminating substance caused by the environment from being carried and diffusing to other processes or process groups.

Therefore, according to the third and fourth embodiments of the semiconductor device producing apparatus and the second embodiment of the semiconductor device producing method, it is possible to prevent the contaminating substance caused by the environment from being carried and diffusing to another process or process group. As a result, it is possible to form a resist pattern which is even more stable than that obtainable by the embodiments described above. Hence, these embodiments are particularly suited for application to a process which uses the chemically amplified resist.

As the processing speeds of the processes become higher, there are demands to make the process automatic for the purpose of reducing the generation of dust particles and contamination, even in the case of processes other than the processes in which the diffusion of the contaminating substance becomes a problem. For this reason, it is necessary to transport a semiconductor wafer or the like by a transport unit such as a robot, so that the semiconductor wafer is transported between various processing units or between the processing unit and a carrier or basket which accommodates the semiconductor wafer, without the need for an operator to intervene which would result in the generation of contamination.

According to a conventional semiconductor wafer transport unit, a chuck which holds the semiconductor wafer is provided with a single suction part, and the semiconductor wafer is held and transported by use of this single suction part. However, when the semiconductor wafer is held by the single suction part, the material forming the semiconductor wafer itself or, the material forming a layer formed on the semiconductor wafer, adheres to the suction part. As a result, the material adhered on the suction part contaminates and deteriorates the characteristics of a semiconductor wafer which is next held by this suction part. The material adhered on the suction part also causes contamination to various processing units. In addition, even if the semiconductor wafers which are held by the single suction part are formed with the same kind of layer, particles of the material forming the semiconductor wafer or the layer formed on the semiconductor wafer adheres to the surface of the suction part after the suction part is used for a long period of time. Such particles brought bad effects on the semiconductor wafer and the layer forming process or the like.

Therefore, when forming a plurality of kinds of layers on the semiconductor wafer, for example, it was impossible to cope with this situation by use of only one transport unit. As a result, there was a problem in that when forming the second and subsequent layers on the semiconductor wafer, the semiconductor wafer had to be transported manually so as to avoid the use of the same transport unit.

In addition, when forming the same kind of layer on the semiconductor wafer, particles of the material forming the semiconductor wafer or the layer adhered on the suction part, and there was a problem in that the suction part had to be cleaned at short time intervals.

The above described problems related to the contamination of the suction part of the chuck are not limited to the case where the semiconductor wafer is transported during production process. Similar problems occur when transporting parts during various chemical and mechanical processes which require strict contamination prevention measures.

Next, a description will be given of fifth through seventh embodiments of the semiconductor device producing apparatus according to the present invention, which are particularly applied to a process in which the diffusion of the contamination substance does not become a problem, and in which the problems related to the contamination of the suction part of the chuck are eliminated.

Figure 13:
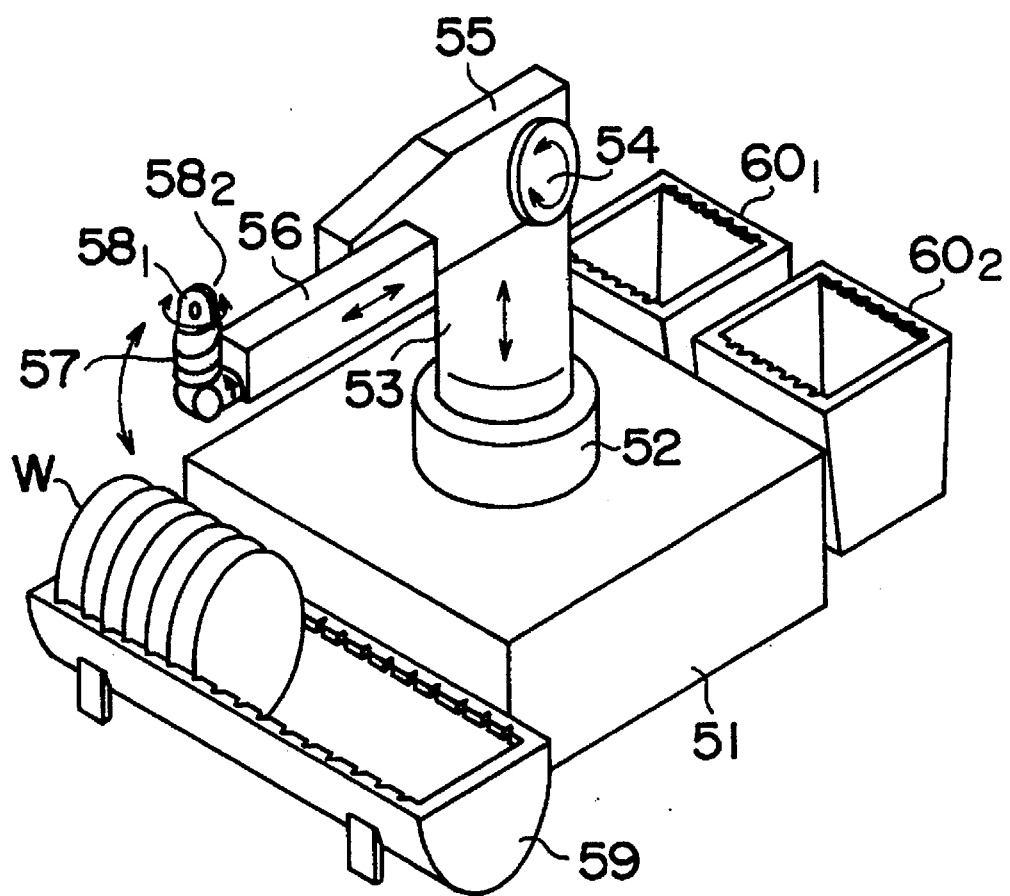
FIG. 13 is a perspective view showing a part transport unit of a fifth embodiment of the semiconductor device producing apparatus according to the present invention.

FIG. 13 is a perspective view generally showing an important part of the fifth embodiment of the semiconductor device producing apparatus according to the present invention. A part transport unit shown in FIG. 13 includes a base 51, a column bearing 52, a column 53, a joint 54, an inner link 55, an outer link 56, a chuck 57, suction parts $58_1$ and $58_2$, a quartz basket 59, and carriers $60_1$ and $60_2$. The quartz basket 59 carries semiconductor wafers w.

According to this embodiment, the column 53 is rotatably assembled on the column bearing 52 which is provided on the base 51. The inner link 55 is assembled on the column 53 via the joint 54 so that the inner link 55 can be rotated to various angular positions. The outer link 56 is assembled on the inner link 55 so that the outer link 56 can be rotated to various angular positions. The base 51, the column bearing 52, the column 53, the joint 54, the inner link 55 and the outer link 56 form a robot.

A plate-shaped chuck 57 is rotatably supported on the tip end of the outer link 56, and suction parts $58_1$ and $58_2$ are provided on both sides of the chuck 57. The chuck 57 is at least rotatable about an axis of the column 53. The quartz basket 59 is arranged at a position which can be reached by the chuck 57, and the semiconductor wafers w are accommodated in the quartz basket 59. The carriers $60_1$ and $60_2$ for accommodating the wafer w are arranged at other positions which can be reached by the chuck 57.

Accordingly, by driving the robot by a means for controlling the direction and position of the suction parts $58_1$ and $58_2$ and a means for moving the position of the chuck 57, the semiconductor wafer w accommodated within the quartz basket 59 can be held by one of the suction parts $58_1$ and $58_2$ provided on both sides of the chuck 57, and be transported to the carrier $60_1$ or $60_2$ which is arranged at the other position that can be reached by the chuck 57.

In this case, the semiconductor wafers w having the same layer material formed thereon are held by the suction parts $58_1$ and $58_2$ by approximately the same suction force and transported, so that the contamination of the suction parts $58_1$ and $58_2$ due to the same kind of semiconductor wafers w is approximately the same for the two suction parts $58_1$ and $58_2$. Hence, the two suction parts $58_1$ and $58_2$ are evenly contaminated, thereby extending the serviceable time until the suction parts $58_1$ and $58_2$ need to be cleaned.

A known vacuum chuck may be used as the chuck 57 described above.

Figure 14A:
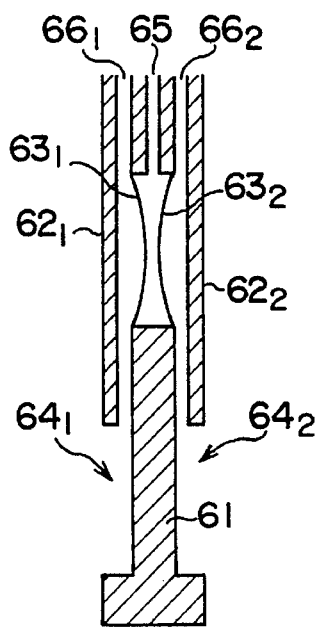
FIGS. 14A, 14B and 14C respectively are diagrams for explaining a vacuum chuck which is used in the part transport unit of the fifth embodiment.
Figure 14B:
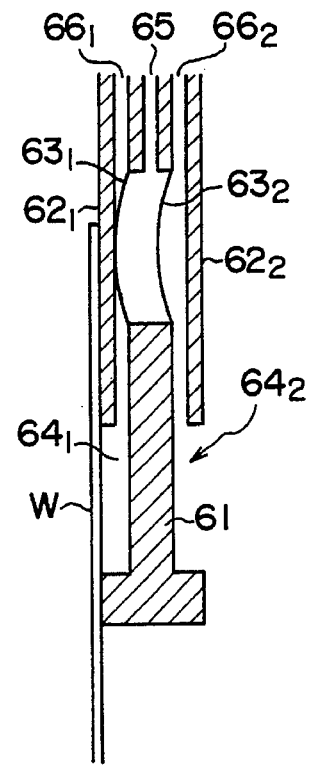
Figure 14C:
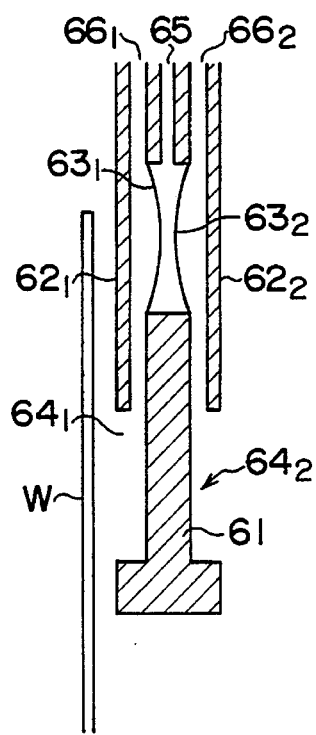

FIGS. 14A through 14C are cross sectional diagrams for explaining a vacuum chuck which may be used as the chuck 57 of the part transport unit. FIGS. 14A, 14B and 14C respectively show various stages of the suction process.

In FIGS. 14A through 14C, the vacuum chuck includes a central wall 61, outer walls $62_1$ and $62_2$, curved resilient partitions $63_1$ and $63_2$, suction parts $64_1$ and $64_2$, a central gap 65, and outer gaps $66_1$ and $66_2$. FIGS. 14B and 14C also show the semiconductor wafer w. The outer walls $62_1$ and $62_2$ are provided on both sides of the central wall 61 so as to maintain the outer gaps $66_1$ and $66_2$. The suction parts $64_1$ and $64_2$ are formed by the openings provided in the outer walls $62_1$ and $62_2$, and the central gap 65 is formed in the central wall 61. The curved resilient partitions $63_1$ and $63_2$ are provided between the central gap 65 and the outer gaps $66_1$ and $66_2$.

Next, a description will be given of the operation of holding the semiconductor wafer w under suction using the vacuum chuck shown in FIGS. 14A through 14C and releasing the semiconductor wafer w from the vacuum chuck.

1. Before holding the semiconductor wafer w under suction (FIG. 14A):

Before holding the semiconductor wafer w under suction, the pressure in the central gap 65 of the vacuum chuck shown in FIG. 14A is set to the normal pressure, and the pressure in the outer gaps $66_1$ and $66_2$ is reduced by exhausting using a pump.

2. When holding the semiconductor wafer w (FIG. 14B):

In the state shown in FIG. 14B, the semiconductor wafer w is attached to the suction part $64_1$ on the left side of the vacuum chuck, and the pressure in the outer gap $66_1$ is reduced. As a result, since the suction part $64_1$ is closed by the semiconductor wafer w, the pressure in the outer gap $66_1$ becomes lower and a pressure difference is introduced between the outer gap $66_1$ and the central gap 65. The curved resilient partition $63_1$ is attracted towards the outside due to this pressure difference, and the resilient partition $63_1$ pushes strongly against the outer wall $62_1$ to close the suction part $64_1$ in the reduced pressure state. Hence, the semiconductor wafer w is held by the suction part $64_1$ under suction. The resilient partition $63_1$ acts as a valve which maintains the closed state as long as no external pressure is applied, and maintains the state where the semiconductor wafer w is held by the suction part $64_1$ even when the reduced pressure state of the outer gap $66_1$ is released. Accordingly, it is possible to disconnect the vacuum chuck from a pressure reducing system and freely transport the semiconductor wafer w to even a distant location where the pressure reducing system cannot be moved to.

3. When removing the semiconductor wafer w (FIG. 14C):

After the semiconductor wafer w is transported to a desired location, the semiconductor wafer w is removed by setting the outer gap $66_1$ to the normal pressure and reducing the pressure of the central gap 65. As a result, the resilient partition $63_1$ curves inwards as shown in FIG. 14C due to the opposite pressure difference introduced between the outer gap $66_1$ and the central gap 65, and releases the outer gap $66_1$ to the normal pressure. Hence, the semiconductor wafer w is no longer held under suction by the suction part $64_1$, and the semiconductor wafer w is removed.

The curved resilient partitions $63_1$ and $63_2$ of the suction parts $64_1$ and $64_2$, which act as pressure-reducing valves, are displaceable towards the inside so that the semiconductor wafer w can be held at either side, that is, by the suction part $64_1$ or $64_2$. Thus, when the semiconductor wafers w having the same kind of layer formed thereon are held by the suction parts $64_1$ and $64_2$ under approximately the same suction force at approximately the same frequency, the contamination of the suction parts $64_1$ and $64_2$ due to the adhesion of particles or the like becomes approximately the same. For this reason, the time intervals at which the suction parts $64_1$ and $64_2$ need to be cleaned can be extended to approximately two times the conventional time interval of the cleaning. Therefore, it is possible to improve the operation efficiency of the transport unit which transports the semiconductor wafers w.

Figure 15A:
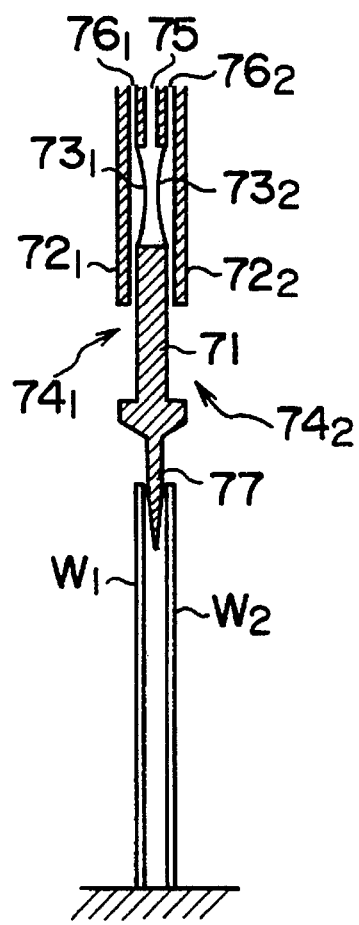
FIGS. 15A and 15B respectively are diagrams for explaining a vacuum chuck which is used in a part transport unit of a sixth embodiment of the semiconductor device producing apparatus according to the present invention.
Figure 15B:
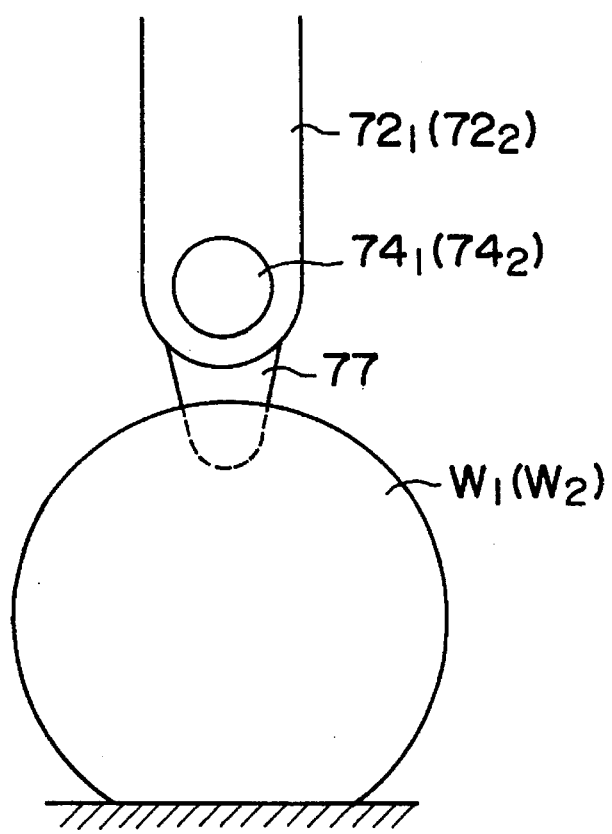

FIGS. 15A and 15B are diagrams for explaining a vacuum chuck which is used in the sixth embodiment of the semiconductor device producing apparatus according to the present invention. FIG. 15A shows a cross section of the vacuum chuck of the part transport unit, and FIG. 15B shows a plan view of the vacuum chuck.

The vacuum chuck shown in FIGS. 15A and 15B includes a central wall 71, outer walls $72_1$ and $72_2$, curved resilient partitions $73_1$ and $73_2$, suction parts $74_1$ and $74_2$, a central gap 75, outer gaps $76_1$ and $76_2$, and a separation blade 77 for separating the semiconductor wafer. FIG. 15A also shows semiconductor wafers w1 and w2.

The vacuum chuck of this embodiment is characterized by the provision of the separation blade 77 at the tip end of the vacuum chuck.

Otherwise, the basic structure of the vacuum chuck shown in FIGS. 15A and 15B is essentially the same as that of the vacuum chuck shown in FIGS. 14A through 14C, and a detailed description thereof will be omitted.

According to the vacuum chuck used in this embodiment, the outer walls $72_1$ and $72_2$ are provided so as to maintain the outer gaps $76_1$ and $76_2$ on both sides of the central wall 71 which is provided with the separation blade 77. The suction parts $74_1$ and $74_2$ are provided by the openings formed in the outer walls $72_1$ and $72_2$. The central gap 75 is formed in the central wall 71, and the curved resilient partitions $73_1$ and $73_2$ are provided between the central gap 75 and the outer gaps $76_1$ and $76_2$.

When forming an oxide layer or various other layers on only one side of the semiconductor wafer, the following technique is employed to improve the processing efficiency. In other words, the two semiconductor wafers w1 and w2 are set within a reaction chamber (not shown) back to back, and the oxide layer or the like is formed on each exposed side (surface) of the two semiconductor wafers w1 and w2. In this case, the two semiconductor wafers w1 and w2 may stick together due to the extremely high flatness of the wafer surface. The two semiconductor wafers w1 and w2 may also be bonded together after a thermal process at a high temperature or, when a material used for forming a layer enters between the two semiconductor wafers w1 and w2.

The vacuum chuck used in this embodiment is provided with means for separating the two semiconductor wafers w1 and w2 which are stuck or bonded as described above, and transporting the separated semiconductor wafers w1 and w2 which are held under suction. In other words, after forming the oxide layer or the like on only one exposed side of each of the two semiconductor wafers w1 and w2 which are set back to back, the separation blade 77 which is provided on the central wall 71 of the vacuum chuck separates the two semiconductor wafers w1 and w2, and holds the separated semiconductor wafers w1 and w2 by the respective suction parts $74_1$ and $74_2$ under suction so that the semiconductor wafers w1 and w2 can be transported to a desired position.

Hence, this embodiment does not require an independent process for separating the two semiconductor wafers w1 and w2 which are stuck or bonded. In addition, it is possible to improve the operation efficiency because the separation and holding of the semiconductor wafers w1 and w2 can be made simultaneously. Furthermore, it is possible to reduce the contamination of the suction parts $74_1$ and $74_2$ to ½ compared to the conventional apparatus using only one suction part. It is also possible to prevent the semiconductor wafers w1 and w2 from being contaminated by the process of separating the semiconductor wafers w1 and w2.

Figure 16:
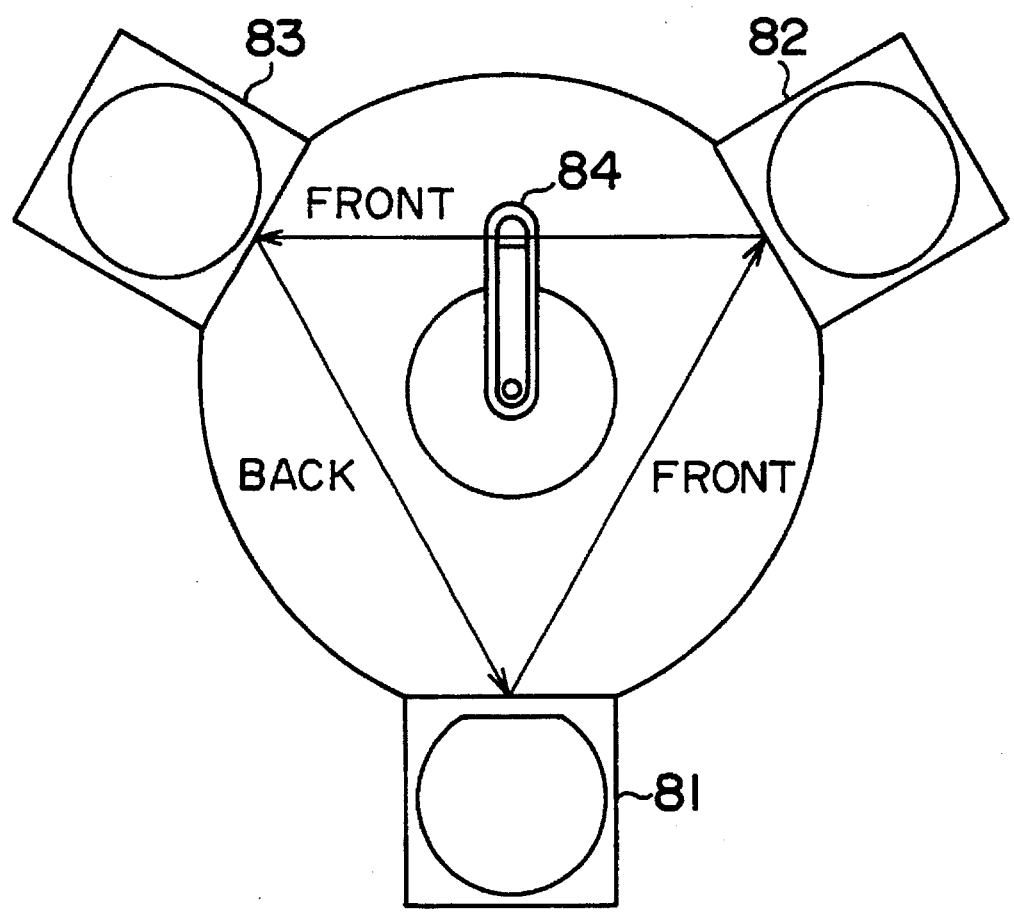
FIG. 16 is a diagram for explaining a method of forming different layers using a part transport unit of a seventh embodiment of the semiconductor device producing apparatus according to the present invention.

FIG. 16 is a diagram for explaining the seventh embodiment of the semiconductor device producing apparatus of the present invention. In this embodiment, a part transport unit shown in FIG. 16 is used when forming different layers on a semiconductor wafer.

The semiconductor device producing apparatus shown in FIG. 16 includes a load lock 81 for receiving and supplying the semiconductor wafer, a first layer forming (or deposition) unit 82 for forming a first layer on the semiconductor wafer, a second layer forming (or deposition) unit 83 for forming a second layer on the semiconductor wafer, and a part transport unit 84. The part transport unit 84 has a chuck at a tip end thereof, and one suction part is provided on each of front and back sides of the chuck. The chuck of the part transport unit 84 is supported by an articulated robot.

In this embodiment, the load lock 81, the first layer forming unit 82 and the second layer forming unit 83 are arranged on a circumference of a predetermined circle. The part transport unit 82 is arranged at a center of this predetermined circle.

One of the semiconductor wafers loaded on the load lock 81 is held by the suction part on the front side of the chuck of the part transport unit 84 and is transported to the first layer forming unit 82 where the first layer such as a $SiO_2$ layer is formed on the semiconductor wafer. Next, the semiconductor wafer having the first layer formed thereon is held by the suction part on the front side of the chuck of the part transport unit 84, similarly to the above, and is transported to the second layer forming unit 83 wherein the second layer such as a $Si_3N_4$ layer is formed on the semiconductor wafer. Then, the semiconductor wafer having the first and second layers formed thereon is held by the suction part on the back side of the chuck of the part transport unit 84 and is transported to the load lock 81. This semiconductor wafer transported to the load lock 81 may thereafter be removed outside the load lock 81.

Hence, the semiconductor wafer having the second layer formed thereon by the second layer forming unit 83 is always transported using the suction part on the back side of the chuck of the part transport unit 84. On the other hand, the semiconductor wafer which is first transported from the load lock 81 and the semiconductor wafer having the first layer formed thereon by the first layer forming unit 82 are always transported using the suction part on the front side of the chuck of the part transport unit 84. For this reason, it is possible to prevent the material forming the second layer from adhering via the suction part to the semiconductor wafer which is first transported from the load lock 81 and the semiconductor wafer having the first layer formed thereon.

According to the fifth through seventh embodiments of the semiconductor device producing apparatus, the vacuum chuck is used as a means of catching the semiconductor wafer, that is, a part. However, when transporting the part within a low-pressure atmosphere such as a vacuum chamber, it is difficult to freely introduce positive and negative pressure differences at the suction parts of the vacuum chuck. Hence, in such environments, it is preferable to use a chuck which has a suction part that uses no pressure difference, such as an electrostatic chuck.

The number of suction parts of the chuck is of course not limited to two as in the case of the described embodiments. It is possible to provide three or more suction parts and selectively use the suction parts depending on the material of the parts, so as to minimize the contamination and to average the contamination among the suction parts.

Therefore, according to the fifth through seventh embodiments of the semiconductor device producing apparatus, a plurality of suction parts are selectively used depending on the material of the parts, so that only the parts of the same material are held by a specific suction part of the chuck when transporting the parts of different materials such as the semiconductor wafers having different kinds of layers formed thereon. As a result, it is possible to reduce the effects of the material forming one part on another material forming another part. In addition, it is possible to minimize the manual transport and prevent contamination caused by the manual transport. Furthermore, when transporting the same kind of parts, the particles which adhere on the suction part of the chuck are distributed over a plurality of suction parts, thereby extending the time intervals at which the cleaning process must be made. This effect of extending the cleaning time intervals of the chuck in the fifth through seventh embodiments of the semiconductor device producing apparatus can also be obtained conveniently in the first through fourth embodiments of the semiconductor device producing apparatus when the fifth through seventh embodiments are applied to the tip end part of the arm of the transport unit used in the first through fourth embodiments.

A third embodiment of the semiconductor device producing method according to the present invention employs the fifth, sixth or seventh embodiment of the semiconductor device producing apparatus according to the present invention. In other words, according to this third embodiment of the semiconductor device producing method, the substrate such as the semiconductor wafer is transported using a chuck which has a plurality of suction parts. Hence, the plurality of suction parts can be selectively used depending on the kind of substrate to be transported and depending on the state of the substrate to be transported.

Hence, it is possible to reduce the effects of the material on the substrate on another substrate. In addition, it is possible to reduce the manual transport of the substrate, and prevent contamination of the substrate that would be caused by the manual transport. Moreover, when transporting the same kind of substrate, the particles adhering to the chuck is evenly distributed over a plurality of suction parts, thereby enabling the cleaning interval to be extended.

In the semiconductor device producing apparatus, an exposure apparatus, for example, exposes patterns on the substrate in a state where the substrate is held by the chuck. However, when a large amount of particles is adhered on the chuck, the portion of the substrate corresponding to the particles becomes raised in the state where the substrate is held by the chuck, and in this case, a focal error (blur) is locally introduced at the time of the exposure. The particles which adhere on the chuck are mostly those which adhere on the back side of the substrate during a previous process or when the substrate is transported. Such particles can be removed by a cleaning process, however, a cleaning process cannot be carried out after the resist is coated on the substrate.

Accordingly, a description will now be given of embodiments which can prevent adhesion of the particles on the chuck or the like in a state where the cleaning process cannot be carried out.

Figure 17A:
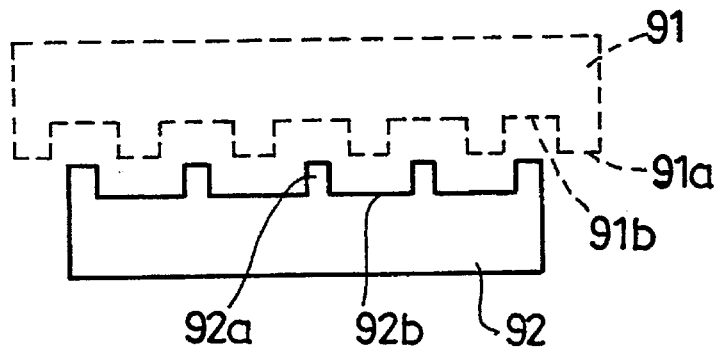
FIGS. 17A, 17B and 17C respectively are diagrams for explaining a substrate transport operation of an eighth embodiment of the semiconductor device producing apparatus according to the present invention.
Figure 17B:
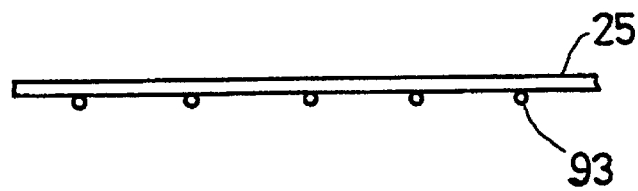
Figure 17C:
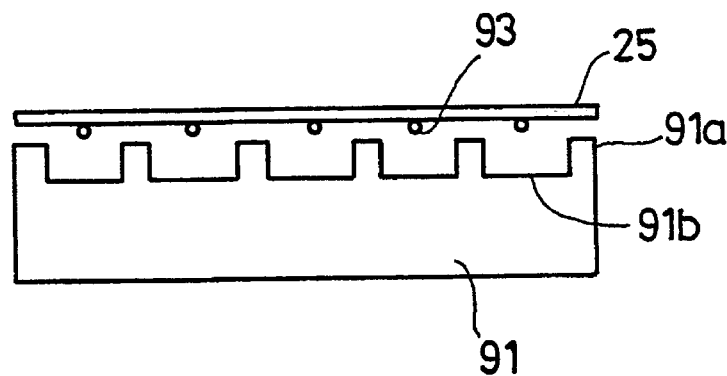

FIGS. 17A through 17C are diagrams for explaining an eighth embodiment of the semiconductor device producing apparatus according to the present invention. FIG. 17A is a cross sectional view showing the relationship of the shapes of a chuck of an exposure apparatus and an arm of a transport unit. FIG. 17B is a cross sectional view for explaining the particles which adhere to the back side of the substrate. In addition, FIG. 17C is a cross sectional view for explaining the chuck of the exposure apparatus which holds the substrate having the particles adhered thereon.

For example, when the resist is coated on the substrate such as the semiconductor wafer and the cleaning process cannot be carried out, it is extremely difficult to completely prevent adhesion of the particles on the substrate. Hence, in this embodiment, measures are taken so that, even if the particles adhere on the back side of the substrate, these particles are prevented from adhering on the chuck or the like of the exposure apparatus.

In other words, in the transport unit of the resist coating unit, the exposure apparatus and the like, the particles adhere mostly when the arm, spin chuck or the like of the transport unit make contact with the back side of the substrate. Hence, as shown in FIG. 17A, the cross sectional shape of a chuck 91 of the exposure apparatus and the cross sectional shape of an arm 92, a spin chuck or the like of the transport unit are set so as to avoid contact between projecting portions. That is, a projecting portion 91a of the chuck 91 corresponds to a recess portion 92b of the arm 92, and a projecting portion 92a of the arm 92 corresponds to a recess portion 91b of the chuck 91.

As a result, even if particles 93 adhered on the projecting portion 92a of the arm 91 when transporting the substrate 25 adhere on the back side of the substrate 25 as shown in FIG. 17B, the particles 93 will confront the recess portion 91b of the chuck 91 as shown in FIG. 17C in a state where the substrate 25 is placed on the chuck 91, and the particles 93 will not adhere on the chuck 91. Hence, although a small amount of the particles 93 are actually adhered on the back side of the substrate 25, the particles 93 will not adhere on the chuck 91. Therefore, when this embodiment is applied to a process such as the exposure process in which the diffusion of the particles 93 does not become a problem, it is possible to prevent undesirable effects of the particles 93 on the process.

Figure 18:
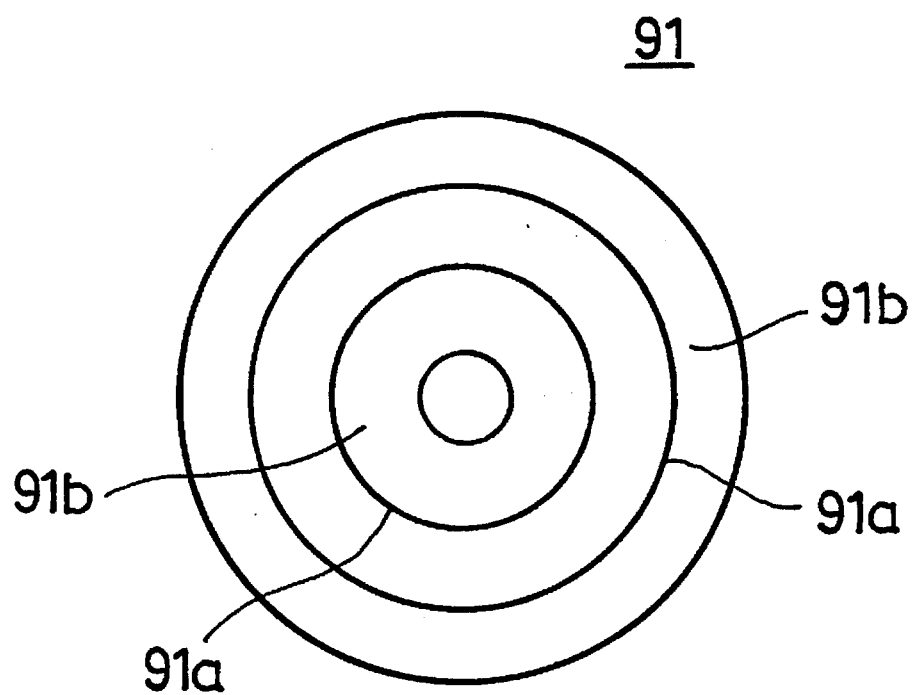
FIG. 18 is a plan view showing the construction of a chuck.

In this embodiment, the chuck 91 has a shape shown in FIG. 18 in the plan view. The projecting portion 91a and the recess portion 91b of the chuck 91 are provided concentrically, and the recess portion 91b communicates to a suction means (not shown) for holding the substrate 25 under suction. The arm 92 may have a construction similar to that of the chuck 91. However, the shapes of the chuck 91 and the arm 92 are of course not limited to those of this embodiment. In addition, it is desirable that the projecting portion 92a is small, and the projecting portion 92a is smaller than the projecting portion 91a in this embodiment.

A third embodiment of the semiconductor device producing method according to the present invention employs the eighth embodiment of the semiconductor device producing apparatus described above. In this third embodiment of the semiconductor device producing method, an arbitrary unit within the semiconductor device producing apparatus has a holding member for holding a substrate, and a transport unit transports the substrate to this arbitrary unit. Measures are taken so that the holding member makes contact with a portion of the substrate other than a portion of the substrate making contact with the transport unit upon transport.

Accordingly, when this embodiment is applied to the exposure apparatus, for example, the particles which adhere on the substrate when the substrate is transported by the transport unit will not adhere on the holding member of the arbitrary unit, and it is possible to positively prevent focal error (blur) from occurring locally on the substrate at the time of the exposure.

Of course, the eighth embodiment of the semiconductor device producing apparatus may be applied to the first through fourth embodiments or the fifth through seventh embodiments of the semiconductor device producing apparatus.

Further, the present invention is not limited to these embodiments, but various variations and modification may be made without departing from the scope of the present invention.

What is claimed is:

1. A semiconductor device producing method comprising the steps of:
   (a) subjecting a substrate which is transported by first transport means to at least a first process within a first unit; and
   (b) subjecting the substrate which is subjected to said step (a) and is transported by second transport means other than said first transport means to at least a second process within a second unit.

2. The semiconductor device producing method as claimed in claim 1, wherein at least one of said steps (a) and (b) includes a process using a chemically amplified resist.

3. The semiconductor device producing method as claimed in claim 1, wherein said steps (a) and (b) respectively carry out the first and second processes within the first and second units which are mutually isolated and sealed.

4. The semiconductor device producing method as claimed in claim 1, which further comprises the step of:
   (c) transporting the substrate using said first or second transport means having a plurality of holding parts by selectively holding the substrate by one of said holding parts.

5. The semiconductor device producing method as claimed in claim 1, which further comprises the step of:
   (c) transporting the substrate using said first or second transport means having a holding part which holds the substrate by making contact with a portion of the substrate other than a portion of the substrate contacted and held by a holding part which holds the substrate within said first or second unit.

6. A semiconductor device producing method comprising the steps of:
   (a) selectively holding one or more kinds of substrates by holding parts of a chuck so that only one kind of substrate is held by each of said holding parts; and
   (b) transporting the substrates held by said holding parts of the chuck, so that contamination via said holding parts of said chuck is avoided when transporting two or more different kinds of substrates,
   said different kinds of substrates being at least one of substrates made of different materials and substrates having different layer materials formed thereon.

7. The semiconductor device producing method as claimed in claim 6, wherein said step (a) uses a chuck having suction parts on both sides thereof as the holding parts.

8. The semiconductor device producing method as claimed in claim 7, which further comprises the step of:
   (c) separating two substrates by use of a chuck having a separating blade prior to carrying out said step (a).

9. The semiconductor device producing method as claimed in claim 6, wherein said steps (a) and (b) transport the substrate on which a first layer is formed by a first layer forming apparatus to a second layer forming apparatus by holding the substrate by a first holding part of the chuck, and transport the substrate on which a second layer is formed by the second layer forming apparatus by holding the substrate by a second holding part of the chuck.

10. A semiconductor device producing method comprising the steps of:
    (a) holding one kind of substrate by each of holding parts of a chuck at about the same frequency; and
    (b) transporting the substrate held by one holding part of the chuck, so that contamination via the holding parts of the chuck is averaged when transporting one kind of substrate,
    said one kind of substrate being one of substrates made of the same material and substrates having the same layer material formed thereon.

11. The semiconductor device producing method as claimed in claim 10, wherein said step (a) uses a chuck having suction parts on both sides thereof as the holding parts.

12. The semiconductor device producing method as claimed in claim 11, which further comprises the step of:
    (c) separating two substrates by use of a chuck having a separating blade prior to carrying out said step (a).

13. The semiconductor device producing method as claimed in claim 10, wherein said steps (a) and (b) transport the substrate on which a first layer is formed by a first layer forming apparatus to a second layer forming apparatus by holding the substrate by a first holding part of the chuck, and transport the substrate on which a second layer is formed by the second layer forming apparatus by holding the substrate by a second holding part of the chuck.

14. A semiconductor device producing method comprising:
    transporting a substrate by a transporter to a processing unit having a holding member which holds said substrate during processing,
    wherein said substrate has first and second holding portions, and wherein said transporter contacts said first holding portion to hold said substrate during transporting, and said holding member contacts said second holding portion to hold said substrate during processing.

15. A semiconductor device producing method comprising the steps of:
    (a) transporting a substrate to a unit by holding the substrate by a first holding part; and
    (b) holding the substrate by a second holding part within said unit,
    said step (a) transporting the substrate so that said first holding part makes contact with a portion of the substrate other than a portion of the substrate contacted by said second holding part.

16. A semiconductor device producing method comprising:
    transporting a substrate to a first processing unit of a semiconductor device producing apparatus by a first transporter;
    subjecting said substrate to a first process at said first processing unit;
    removing said substrate from said first processing unit; and thereafter
    transporting said substrate to a second processing unit of said semiconductor device producing apparatus by a second transporter that is not the same as said first transporter; and
    subjecting said substrate to a second process at said second processing unit.

17. A semiconductor device producing method as set forth in claim 16, wherein at least one of said processes comprises a process which utilizes a chemically amplified resist.

18. A semiconductor device producing method as set forth in claim 16, wherein said processing units each includes a respective sealable isolation area and said processes are carried out within said areas.

19. A semiconductor device producing method as set forth in claim 16, wherein at least one of said transporters includes a plurality of holding parts and said transporting of said substrate thereby includes selectively holding said substrate by one of said holding parts.

20. A semiconductor device producing method as set forth in claim 16, wherein one of said processing units includes a holding member which holds said substrate during processing, wherein said substrate has first and second holding portions, and wherein the transporter which transports said substrate to said one of said processing units contacts said first holding portion to hold said substrate during said transporting and said holding member contacts said second holding portion to hold said substrate during said processing.

21. A semiconductor device producing method as set forth in claim 16, wherein said first process comprises applying a material to said substrate, and said use of said second transporter avoids contamination of said substrate with said material prior to said second process.

22. A semiconductor device producing method as set forth in claim 16, wherein said first and second transporters comprise respective first and second suction parts located on opposite sides of a chuck.

23. A semiconductor device producing method as set forth in claim 16, further comprising separating two substrates using a chuck having a separating blade prior to transporting said processed substrate from said first processing unit.

24. A semiconductor device producing method as set forth in claim 16, wherein said first process comprises applying a first material to said substrate and said second process comprises applying a second material, different from said first material, to said substrate.

25. A semiconductor device producing method as set forth in claim 16, wherein said first and second transporters hold said substrate at about the same frequency.

\* \* \* \* \*

UNITED STATES PATENT AND TRADEMARK OFFICE
CERTIFICATE OF CORRECTION

PATENT NO. : 5,609,688
DATED : Mar. 11, 1997
INVENTOR(S) : HAYASHI et al.

It is certified that error appears in the above-indentified patent and that said Letters Patent is hereby corrected as shown below:

TITLE PAGE:

[73] Assignee: Delete and replace with the following:

--Fujitsu Limited, Kawasaki; Fujitsu Tohoku Electronics Ltd., Aizuwakamatsu, both of Japan--.

[56] References Cited: Change "5,422,889" to --5,421,889--.

Col. 2, line 19, change "duping" to --during--;
line 28, change "mope" to --more--.

Col. 5, line 9, change "shades" to --shapes--.

Signed and Sealed this

Twenty-fifth Day of November, 1997

Attest:

BRUCE LEHMAN

Attesting Officer  Commissioner of Patents and Trademarks